United States Patent
Huang et al.

(10) Patent No.: US 11,942,570 B2
(45) Date of Patent: Mar. 26, 2024

(54) MICRO LIGHT-EMITTING DIODE COMPRISING NANORING AND MANUFACTURING METHOD THEREOF

(71) Applicant: CHONGQING KONKA PHOTOELECTRIC TECHNOLOGY RESEARCH INSTITUTE CO., LTD., Chongqing (CN)

(72) Inventors: Kuo-Tung Huang, Chongqing (CN); Ya-Wen Lin, Chongqing (CN); Chia-Hung Huang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 424 days.

(21) Appl. No.: 17/392,665

(22) Filed: Aug. 3, 2021

(65) Prior Publication Data

US 2021/0367101 A1    Nov. 25, 2021

Related U.S. Application Data

(63) Continuation of application No. PCT/CN2020/085967, filed on Apr. 21, 2020.

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0093* (2020.05); *H01L 33/14* (2013.01);
(Continued)

(58) Field of Classification Search
CPC ....... H01L 33/06; H01L 33/32; H01L 33/502; H01L 2933/0041; H01L 33/14; H01L 33/382; H01L 2933/0016
See application file for complete search history.

(56) References Cited

U.S. PATENT DOCUMENTS

| | | | |
|---|---|---|---|
| 2015/0076535 A1* | 3/2015 | Choung | H01L 33/08 257/91 |
| 2016/0079469 A1* | 3/2016 | Chiu | H01L 33/32 438/34 |
| 2016/0300978 A1 | 10/2016 | Kim et al. | |

FOREIGN PATENT DOCUMENTS

| | | |
|---|---|---|
| CN | 109817792 A | 5/2019 |
| CN | 109841711 A | 6/2019 |
| CN | 110571312 A | 12/2019 |

OTHER PUBLICATIONS

International Search Report issued in corresponding International Application No. PCT/CN2020/085967, dated Jan. 11, 2021, pp. 1-10, Beijing, China.

\* cited by examiner

*Primary Examiner* — Nduka E Ojeh
(74) *Attorney, Agent, or Firm* — HAUPTMAN HAM, LLP

(57) ABSTRACT

A micro LED and a manufacturing method thereof are provided. The micro LED includes a first semiconductor layer, an active layer, and a second semiconductor layer that are successively stacked together. The first semiconductor layer and the second semiconductor layer are of different types. The active layer includes a first quantum well layer and a second quantum well layer stacked together. The second quantum well layer and the second semiconductor layer form a nanoring. The first quantum well layer is configured to emit light of a first color. The second quantum well layer forming a sidewall of the nanoring is configured (Continued)

to emit light of a second color different from the first color. The first semiconductor layer is electrically coupled to a first electrode, and the second semiconductor layer is electrically coupled to a second electrode. A manufacturing method for a micro LED is provided.

20 Claims, 5 Drawing Sheets

(51) Int. Cl.
    *H01L 33/14*     (2010.01)
    *H01L 33/32*     (2010.01)
    *H01L 33/38*     (2010.01)
    *H01L 33/50*     (2010.01)

(52) U.S. Cl.
    CPC ............ *H01L 33/32* (2013.01); *H01L 33/382* (2013.01); *H01L 33/502* (2013.01); *H01L 2933/0016* (2013.01); *H01L 2933/0041* (2013.01)

MICRO LIGHT-EMITTING DIODE COMPRISING NANORING AND MANUFACTURING METHOD THEREOF

CROSS-REFERENCE TO RELATED APPLICATION(S)

This application is a continuation of International application No. PCT/CN2020/085967, filed on Apr. 21, 2020, the disclosure of which is hereby incorporated by reference in its entirety.

TECHNICAL FIELD

This disclosure relates to the technical field of manufacturing of LED displays, and more particularly to a micro light-emitting diode (LED) and a manufacturing method thereof.

BACKGROUND

Common LED chips include a substrate and an epitaxy layer. The LED chip has the thickness of about 100~500 μm and the size ranging from 100 μm to 1000 μm. Further ongoing study of a micro LED display panel is to peel off the epitaxy layer with a thickness of about 4~5 μm on a surface of the LED via a physical or chemical lift-off mechanism and then transplant the epitaxy layer to a circuit board. The micro LED display integrates a thin film transistor liquid crystal display (TFT-LCD) and the LED and thus has two technical characteristics of the TFT-LCD and the LED. The micro LED display is relatively mature in development of materials, processes, and apparatuses. The product specifications of the micro LED are much higher than that of the TFT-LCD or an organic LED (OLED). The micro LED display is widely used in flexible and transparent displays and is a highly feasible next-generation flat panel display technology.

At present, there are two manners to apply the micro LED chips to full-color augmented reality (AR) micro displays and mobile/large-scale displays. One manner is to use micro LED chips of three primary colors (red, green, and blue, RGB) to naturally mix colors. The other manner is to use quantum dots (QDs) and blue micro LED chips to mix colors. In case that the natural color mixing is realized by using micro LED chips of RGB, since the red micro LED chip is made from gallium arsenide (GaAs) materials and the green and blue micro LED chips are made from indium gallium nitride (InGaN) materials, difficulties in the circuit design of the display panel may be caused. On the contrary, if the quantum dots and the blue micro LED chips are used, the efficiency of color conversion of green quantum dots is not high, resulting in low full-color efficiency.

SUMMARY

In view of the above, the disclosure aims to provide a micro light-emitting diode (LED), which can mix light of three colors into white light. The structure of the micro LED is as follows.

A micro LED is provided. The micro LED includes a first semiconductor layer, an active layer, and a second semiconductor layer that are successively stacked together. The first semiconductor layer and the second semiconductor layer are of different types. The active layer includes a first quantum well layer and a second quantum well layer stacked together. The second quantum well layer and the second semiconductor layer form a nanoring. The first quantum well layer is configured to emit light of a first color. The second quantum well layer forming a sidewall of the nanoring is configured to emit light of a second color different from the first color. The first semiconductor layer is electrically coupled to a first electrode, and the second semiconductor layer is electrically coupled to a second electrode.

In one example, the first semiconductor layer is an N-type semiconductor layer, and includes a low-temperature gallium nitride (GaN) layer, an undoped GaN layer, and an N-type GaN layer that are successively stacked. The second semiconductor layer is a P-type semiconductor layer. For example, the second semiconductor layer is a P-type GaN layer. GaN is a compound of nitrogen and gallium, and is a semiconductor compound with a direct energy gap.

In one example, the nanoring is filled with color conversion materials. The color conversion materials are configured to convert the light of the first color emitted by the first quantum well layer into light of a third color, where the first color, the second color, and the third color are different from one another.

In one example, the first quantum well layer and the second quantum well layer are both green quantum well layers, and the first quantum well layer and the second quantum well layer each are made from InGaN and GaN materials. InGaN is an indium gallium nitride compound, a third-generation semiconductor material, and it is widely used in optoelectronic devices.

In one example, the color conversion materials are red quantum dots.

In one example, a pair of quantum wells comprise an indium gallium nitride (InGaN) well layer, a low-temperature GaN well layer, and a high-temperature GaN well layer that are stacked successively, and the first quantum well layer and the second quantum well layer each comprise ten pairs of green quantum wells.

In one example, the nanoring has an outer diameter ranging from 10 nm to 2000 nm.

In one example, the nanoring has an outer diameter ranging from 100 nm to 900 nm.

In one example, the nanoring has a cross section of a circular, a square, a rectangular, or any closed-loop shape.

In one example, a current diffusion layer is formed on the second semiconductor layer, where the current diffusion layer is made from an indium tin oxide (ITO) material. The second electrode is formed on a surface of the current diffusion layer away from the second semiconductor layer. ITO is an N-type oxide semiconductor (i.e., indium tin oxide), used on semiconductor chips, and has excellent electrical conductivity and mechanical properties.

In one example, the first electrode is formed on a surface of the first semiconductor layer facing the second semiconductor layer, and a surface of the first electrode is flush with that of the second electrode.

In one example, the first electrode is formed on a surface of the first semiconductor layer away from the second semiconductor layer.

A manufacturing method for a micro LED is provided. The manufacturing method includes the following.

A substrate is provided, a first semiconductor layer is formed on the substrate, and an active layer is formed on the first semiconductor layer, where the first semiconductor layer is a gallium nitride (GaN) semiconductor layer, and the active layer includes a first quantum well layer and a second quantum well layer. The first quantum well layer includes is configured to emit light of a first color.

A second semiconductor layer is formed on the active layer, where the second semiconductor layer and the first semiconductor layer are of different types.

The second semiconductor layer and the second quantum well layer are etched to form a multiple nanorings, where a sidewall of each of the multiple nanorings is configured to emit light of a second color different from the first color.

A current diffusion layer is formed on the first quantum well layer and the multiple nanorings.

A second electrode is formed on the current diffusion layer.

In at least one implementation, after the second electrode is formed on the current diffusion layer, the following can be conducted. A part of the current diffusion layer, a part of the multiple nanorings, and a part of the first quantum well layer are removed, to expose a part of the first semiconductor layer. A first electrode is formed on the exposed part of first semiconductor layer, where an upper surface of the first electrode is flush with that of the second electrode. The substrate is removed, a remaining part is transferred to a display panel, and the first electrode and the second electrode are bonded to electrodes on the display panel.

In one example, after forming the multiple nanorings and prior to forming the current diffusion layer on the multiple nanorings, the following can be conducted. Color conversion materials are filled in the multiple nanorings, where the color conversion materials are configured to convert the light of the first color into light of a third color, wherein the third color is different from the first color and the second color.

In at least one implementation, the color conversion materials are red quantum dots.

In at least one implementation, a pair of quantum wells comprise an indium gallium nitride (InGaN) well layer, a low-temperature GaN well layer, and a high-temperature GaN well layer that are stacked successively, and the first quantum well layer and the second quantum well layer each comprise a plurality of pairs of green quantum wells.

In at least one implementation, number of quantum wells of the first quantum well layer is the same as that of the second quantum well layer.

In at least one implementation, after forming the second electrode on the current diffusion layer, the substrate is removed, and a third electrode is formed on a surface of the first semiconductor layer away from the active layer.

In at least one implementation, the nanoring has a cross section of a circular, a square, or any closed-loop shape, and has an outer diameter ranging from 10 nm to 2000 nm.

Implementing the disclosure has the following advantages.

According to the micro LED and the manufacturing method thereof, the part of the green quantum well is arranged as the nanorings and the red quantum dots are filled in the nanorings, which can make the part of the quantum well structure that does not form the nanorings emit green light, the nanorings emit blue light due to a change in a light wavelength caused by release of material stress, and the red quantum dots emit red light, such that the quantum well structure can spontaneously emit white light after light of three colors is mixed. According to implementations of the disclosure, with the nanorings, it is possible to a problem that spontaneous built-in electric field generated due to different electron affinities causes energy band bending in the quantum well and accordingly results in a reduction of the efficiency of electron-hole recombination, thereby improving the efficiency of electron-hole recombination. The micro LED chip of the disclosure has the size of 10~80 um, which can make the AR micro display and mobile/large-scale display have ultra-high resolution.

In implementations of the disclosure, a silicon dioxide ($SiO_2$) nano-sphere is used as a photomask, and nanorings are formed by adopting yellow photolithography etching process, which may cause the stress of the quantum well to be released, such that the quantum confined stark effect (QCSE) may be weakened, and the blue light may be produced. The red quantum dots are put into the nanorings by spraying to uniformly cover the inside of the nanorings, such that the efficiency of the color conversion can be improved due to the surface area effect of the nanorings.

Reference numbers in the figures are illustrated as follows.

10: a substrate; 11: a first semiconductor layer; 111: a low-temperature GaN layer; 112: undoped GaN layer; 113: N-type GaN layer; 12: active layer; 121: first quantum well layer; 122: second quantum well layer; 13: second semiconductor layer; 14: nanoring; 114: first electrode; 15: color conversion material; 16: second electrode; 17: current diffusion layer; 20: display panel; 18: third electrode.

DETAILED DESCRIPTION

Technical solutions embodied in implementations of the disclosure will be described in a clear and comprehensive manner in conjunction with the accompanying drawings. It is evident that the implementations described herein are merely some rather than all the implementations of the disclosure.

The terms "first", "second", "third", and the like used in the disclosure are for descriptive purposes, and cannot be understood as indicating or implying relatively importance of technical features indicated or implicitly indicating the number of the technical features. Therefore, the features defined with "first", "second", "third", or the like may explicitly or implicitly include at least one of the features. In the description of the disclosure, "a plurality of", "a number of", and "multiple" means at least two, such as two, three, or the like, unless specifically defined otherwise.

Implementation 1

Figure 1:
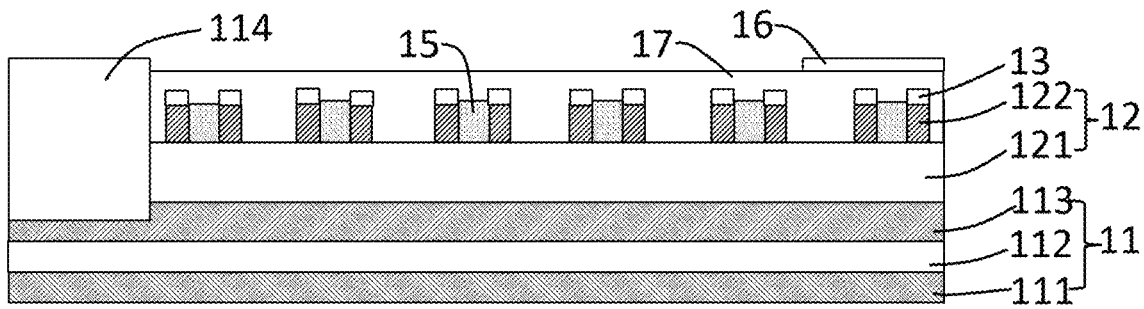
FIG. 1 illustrates a micro LED according to implementations of the disclosure.

FIG. 1 illustrates a micro LED according to implementations of the disclosure.

As illustrated in FIG. 1, the micro LED includes a first semiconductor layer 11, an active layer 12, and a second semiconductor layer 13.

The first semiconductor layer 11 is an N-type semiconductor layer. For example, the first semiconductor layer 11 is made from gallium nitride (GaN) which is a new-generation energy material and widely used in LEDs.

In one example, the first semiconductor layer 11 includes a low-temperature GaN layer 111, where an undoped GaN layer 112 and an N-type GaN layer 113 are successively stacked on the low-temperature GaN layer 111.

The active layer 12 is a quantum well layer. The active layer 12 includes multiple pairs of quantum wells. The active layer 12 includes a first quantum well layer 121 and a second quantum well layer 122. In implementations of the disclosure, the quantum well layer is a green quantum well layer, that is, the quantum well layer emits green light after being electrified.

In implementations of the disclosure, a pair of quantum wells include an indium gallium nitride (InGaN) well layer, a low-temperature GaN well layer, and a high-temperature GaN well layer that are stacked successively. In one example, the first quantum well layer 121 includes ten pairs of quantum wells. Due to a thickness of the ten pairs of quantum wells, a relatively high degree of adaptability can be provided in use and manufacturing, and it is not difficult to manufacture the micro LED under the premise that the size of the micro LED is reasonably controlled. Alternatively, the first quantum well layer 121 can be formed by stacking other numbers of quantum wells, which depends on the chip design.

A first electrode 114 is formed on the first semiconductor layer 11. The first electrode 114 is partially embedded in the first semiconductor layer 11. Alternatively, the first electrode 114 is disposed on and coupled to the first semiconductor layer 11.

Nanorings 14 are formed on the first quantum well layer 121. The nanoring 14 has an outer diameter R ranging from 10 nm to 2000 nm. In one example, the outer diameter R of the nanoring 14 ranges from 100 nm to 900 nm. The nanoring 14 having the outer diameter R is easy to be realized in process, and with the nanoring 14, light of three colors can be controlled to be mixed uniformly.

Figure 2:
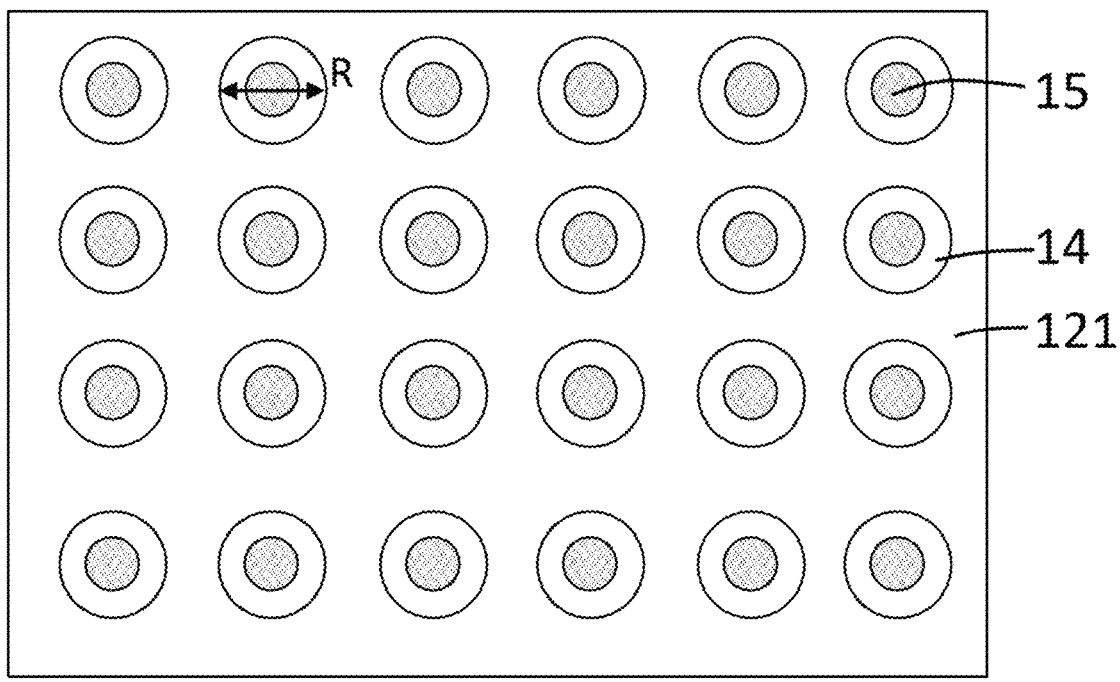
FIG. 2 is a plane view illustrating nanorings on a first quantum well.

As illustrated in FIG. 1 and FIG. 2, the nanoring 14 has a hollow cylindrical shape and is formed on the first quantum well layer 121. In other implementations, the nanoring 14 may also be in any other three-dimensional shape, as long as the nanoring 14 is hollow. For example, a cross section of the nanoring 14 may be a square, a rectangular, or any other polygonal shape, or any closed-loop shape. With the nanorings, it is possible to alleviate a problem that spontaneous built-in electric field generated due to different electron affinities causes energy band bending in the quantum well and accordingly results in a reduction of the efficiency of electron-hole recombination, thereby improving the efficiency of electron-hole recombination.

The second quantum well layer 122 and the second semiconductor layer 13 form sidewalls of the nanorings 14. The second quantum well layer 122 is disposed between the first quantum well layer 121 and the second semiconductor layer 13.

The nanoring 14 is filled with color conversion materials 15. The color conversion materials 15 are red quantum dots. The red quantum dots can convert green light emitted by the first quantum well layer 121 into red light. Filling the red quantum dots in the nanoring 14 can make a part of the quantum well structure that does not form the nanoring 14 emit green light, the second green quantum well layer 122 forming the nanoring 14 emit blue light due to a change in a light wavelength caused by release of material stress, and the red quantum dots convert the green light emitted by the first quantum well layer 121 into red light, such that the quantum well structure can spontaneously emit white light after light of three colors is mixed.

A second electrode 16 is formed on the second semiconductor layer 13. The second electrode 16 is an external electrode. In one example, the second electrode 16 is made from an indium tin oxide (ITO) conductive film.

A pair of quantum wells include an InGaN well layer, a low-temperature GaN well layer, and a high-temperature GaN well layer that are stacked successively. The first quantum well layer 121 and the second quantum well layer 122 both include ten pairs of quantum wells. The stacked layer of this thickness can be easily realized in process, has high luminous efficiency, and does not make the epitaxy layer too thick.

A current diffusion layer 17 is formed on the nanorings 14 and the first quantum well layer 121. The current diffusion layer 17 completely covers the nanorings 14 and the first quantum well layer 121. The current diffusion layer 17 is made from transparent oxide, such as, ITO.

At least one second electrode 16 is formed on the current diffusion layer 17. An upper surface of the first electrode 14 and an upper surface of the second electrode 16 are on the same horizontal plane, such that the micro LED can be packaged by adopting the flip-chip packaging manner.

Implementation 2

Implementation 2 illustrates a micro LED according to other implementations of the disclosure.

Figure 3:
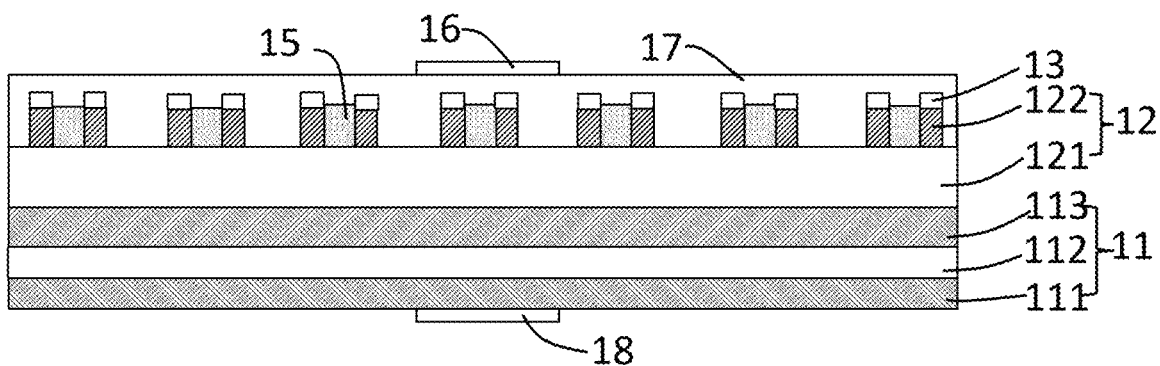
FIG. 3 illustrates a micro LED according to other implementations of the disclosure.

As illustrated in FIG. 3, the micro LED includes a first semiconductor layer 11, an active layer 12, and a second semiconductor layer 13.

The first semiconductor layer 11 is an N-type semiconductor layer. For example, the first semiconductor layer 11 is made from GaN which is a new-generation energy material and widely used in LEDs.

The first semiconductor layer 11 includes a low-temperature GaN layer 111, where an undoped GaN layer 112 and an N-type GaN layer 113 are successively stacked on the low-temperature GaN layer 111.

The active layer 12 is a quantum well layer. The active layer 12 includes multiple pairs of quantum wells. The active layer 12 includes a first quantum well layer 121 and a second quantum well layer 122. In implementations of the disclosure, the quantum well layer is a green quantum well layer, that is, the quantum well layer emits green light after being electrified.

In implementations of the disclosure, a pair of quantum wells include an InGaN well layer, a low-temperature GaN well layer, and a high-temperature GaN well layer that are stacked successively. In one example, the first quantum well layer 121 includes ten pairs of quantum wells. Due to the thickness of the ten pairs of quantum wells, a relatively high degree of adaptability can be provided in use and manufacturing, and it is not difficult to manufacture the micro LED under the premise that the size of the micro LED is reasonably controlled. Alternatively, the first quantum well layer 121 can be formed by stacking other numbers of quantum wells, which depends on the chip design.

Nanorings 14 are formed on the first quantum well layer 121. The nanoring 14 has an outer diameter R ranging from 10 nm to 2000 nm. In one example, the outer diameter R of the nanoring 14 ranges from 100 nm to 900 nm. The nanoring 14 having the outer diameter R ranging from 100 nm to 900 nm is easy to be realized in process, and with the nanoring 14, light of three colors can be controlled to be mixed uniformly.

As illustrated in FIG. 2 and FIG. 3, the nanoring 14 has a hollow cylindrical shape and is formed on the first quantum well layer 121. In other implementations, the nanoring 14 may also be in any other three-dimensional shape, as long as the nanoring 14 is hollow. For example, a cross section of the nanoring 14 may be a square, a rectangular, or any other polygonal shape, or any closed-loop shape. With the nanorings, it is possible to alleviate a problem that spontaneous built-in electric field generated due to different electron affinities causes energy band bending in the quantum well and accordingly results in a reduction of the efficiency of electron-hole recombination, thereby improving the efficiency of electron-hole recombination.

The second quantum well layer 122 and the second semiconductor layer 13 form sidewalls of the nanorings 14. The second quantum well layer 122 is disposed between the first quantum well layer 121 and the second semiconductor layer 13.

The nanoring 14 is filled with color conversion materials 15. The color conversion materials 15 are red quantum dots. The red quantum dots can convert green light emitted by the first quantum well layer 121 into red light. Filling the red quantum dots in the nanoring can make a part of the quantum well structure that does not form the nanoring 14 emit green light, the second green quantum well layer 122 forming the nanoring 14 emit blue light due to a change in a light wavelength caused by release of material stress, and the red quantum dots convert the green light emitted by the first quantum well layer 121 into red light, such that the quantum well structure can spontaneously emit white light after light of three colors is mixed.

A second electrode 16 is formed on the second semiconductor layer 13. The second electrode 16 is an external electrode. In one example, the second electrode 16 is made from an Indium tin oxide (ITO) conductive film.

A third electrode 18 is formed on a surface of the first semiconductor layer 11 away from the active layer 12. The third electrode 18 is made from an ITO thin film material. The manner in which the third electrode 18 is formed as follows. The ITO material is deposited on the first semiconductor layer 11 to form a thin film, and then the thin film is etched to form a third electrode. The ITO material can be used for manufacturing electrodes in LEDs and has excellent mechanical properties and electrical conductivity.

A pair of quantum wells includes an InGaN well layer, a low-temperature GaN well layer, and a high-temperature GaN well layer that are stacked successively. The first quantum well layer 121 and the second quantum well layer 122 both include ten pairs of quantum wells. The stacked layer of this thickness can be easily realized in process, has high luminous efficiency, and does not make the epitaxy layer too thick.

A current diffusion layer 17 is formed on the nanorings 14 and the first quantum well layer 121. The current diffusion layer 17 completely covers the nanorings 14 and the first quantum well layer 121. The current diffusion layer 17 is made from transparent oxide, such as, ITO.

Implementation 3

Figure 4:
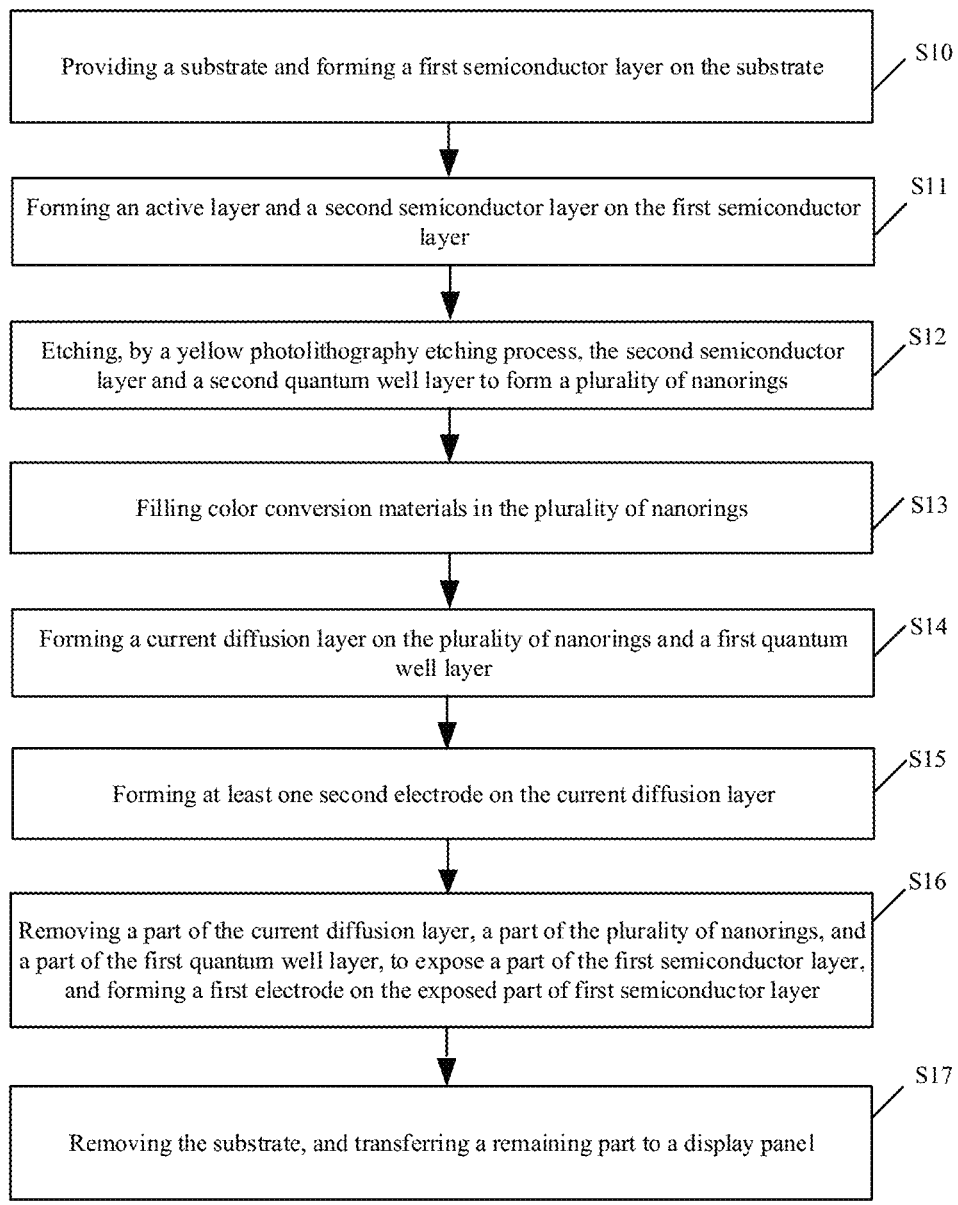
FIG. 4 is a flow chart illustrating a manufacturing method for a micro LED.

FIG. 4 is a flow chart illustrating a manufacturing method for a micro LED according to implementations of the disclosure. The method begins at S10.

At S10, a substrate 10 is provided and a first semiconductor layer 11 is formed on the substrate 10.

Figure 5:
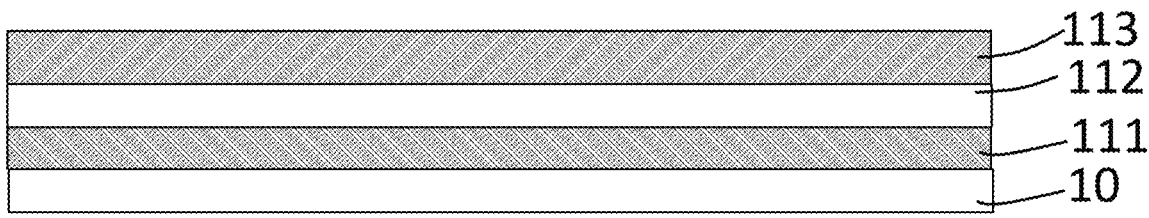
FIG. 5 is a schematic structural view illustrating forming a first semiconductor layer on a substrate.

As illustrated in FIG. 5, the first semiconductor layer 11 includes a low-temperature gallium nitride (GaN) layer 111, an undoped GaN layer 112, and an N-type GaN layer 113 that are successively stacked. The substrate 10 is a sapphire substrate.

At S11, an active layer 12 and a second semiconductor layer 13 are formed on the first semiconductor layer 11.

Figure 6:
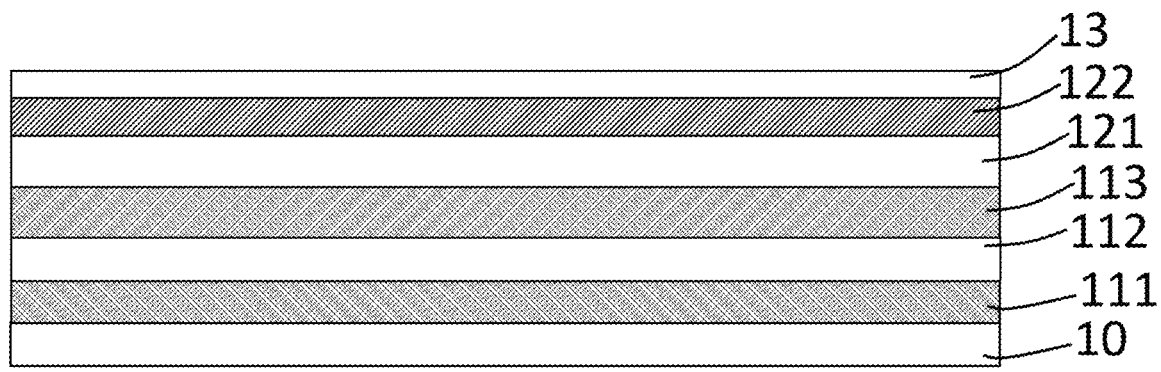
FIG. 6 is a schematic structural view illustrating forming an active lay and a second semiconductor layer on the first semiconductor layer.

As illustrated in FIG. 6, the active layer 12 is a quantum well layer. The active layer 12 includes a first quantum well layer 121 and a second quantum well layer 122. The second semiconductor layer 13 is formed on the second quantum well layer 122. The first semiconductor layer 11 and the second semiconductor layer 13 are of different types. In implementations of the disclosure, the first semiconductor layer 11 is an N-type semiconductor layer, and the second semiconductor layer is a P-type semiconductor layer. For example, the second semiconductor layer 13 is a P-type GaN layer.

In one example, a pair of quantum wells include an InGaN well layer, a low-temperature GaN well layer, and a high-temperature GaN well layer that are stacked successively. The first quantum well layer 121 and the second quantum well layer 122 each include ten pairs of green quantum wells. The first quantum well layer 121 and the second quantum well layer 122 of such thickness can be easy to be manufactured since a thinner quantum well layer may require higher process requirements and may affect the light emitting effect and a thicker quantum well layer may be not conducive to the thinning of the display panel.

Figure 7:
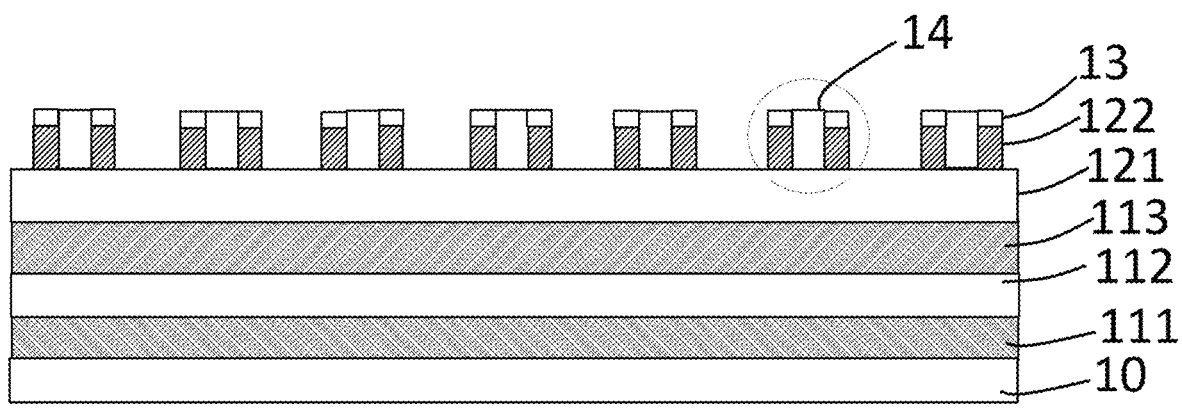
FIG. 7 is a schematic structural view illustrating forming of nanorings.

At S12, in combination with FIG. 7, the second semiconductor layer 13 and the second quantum well layer 121 are etched by a yellow photolithography etching process to form multiple nanorings 14.

The yellow photolithography etching process is illustrated as follows. A patterned photomask is formed on the second semiconductor layer 13 by using nano-silicon dioxide (nano-SiO2) particles, and then the second semiconductor layer 13 and the second quantum well layer 121 are etched by dry etching to form the multiple nanorings 14. If the yellow photolithography etching is adopted without usage of the nano-SiO2 particles, a planar epitaxy emits green light since there is no stress released. However, if the nanorings 14 are formed by using SiO2 nano-spheres and adopting the yellow photolithography etching process, since quantum confined stark effect (QCSE) is weakened due to release of the stress of the quantum well, the blue light is produced.

At S13, color conversion materials 15 are filled in the multiple nanorings 14.

Figure 8:
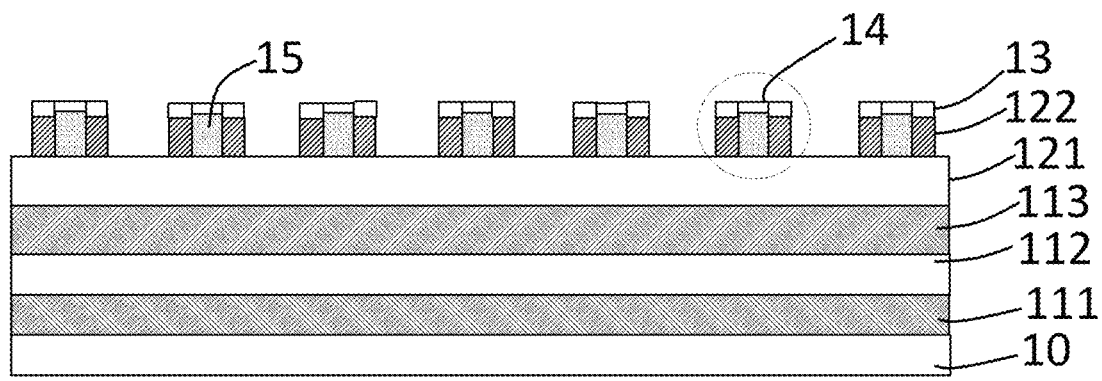
FIG. 8 is a schematic structural view illustrating filling color conversion materials in nanorings.

As illustrated in FIG. 8, the color conversion materials 15 are red quantum dots. The red quantum dots are sprayed into the nanorings 14 by spraying. Filling the red quantum dots in the nanoring can make a part of the quantum well structure that does not form the nanoring 14 emit green light, the second green quantum well layer 122 forming the nanoring 14 emit blue light due to a change in a light wavelength caused by release of material stress, and the red quantum dots convert the green light emitted by the first quantum well layer 121 into red light, such that the quantum well structure can spontaneously emit white light after light of three colors is mixed.

At S14, a current diffusion layer 17 is formed on the first quantum well layer 121 and the multiple nanorings 14.

Figure 9:
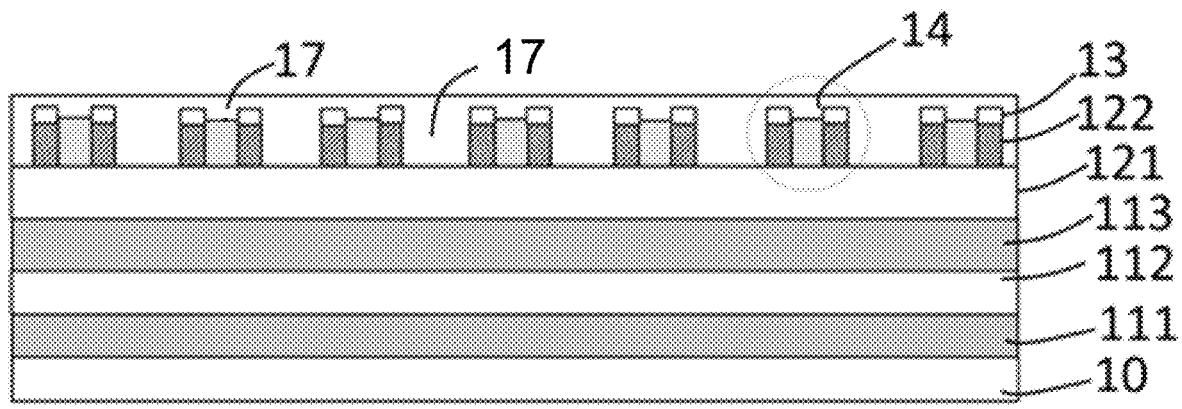
FIG. 9 is a schematic structural view illustrating forming a current diffusion layer.

As illustrated in FIG. 9, the current diffusion layer 17 is a transparent oxide layer. The current diffusion layer 17 is an ITO film, which is formed by depositing an ITO material.

At S15, at least one second electrode 16 is formed on the current diffusion layer 17.

Figure 10:
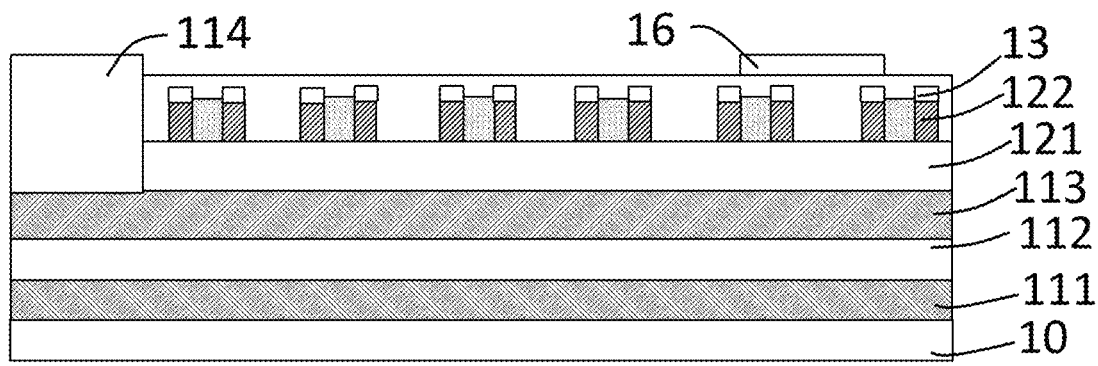
FIG. 10 is a schematic structural view illustrating forming a second electrode.

As illustrated in FIG. 10, the second electrode 16 is an ITO film. The second electrode 16 is formed by depositing the ITO material on the current diffusion layer 17 and then selectively etching the ITO film.

At S16, a part of the current diffusion layer 17, a part of the nanorings 14, and a part of the first quantum well layer 121 are removed to expose a part of the first semiconductor layer 11, and a first electrode 114 is formed on the exposed part of the first semiconductor layer 11.

Figure 11:
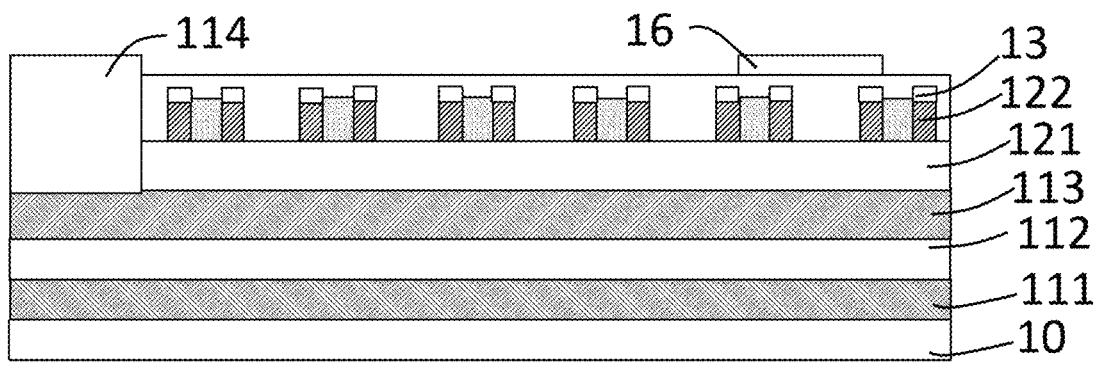
FIG. 11 is a schematic structural view illustrating forming a first electrode is formed.

In one example, as illustrated in FIG. 11, an upper surface of the first electrode 114 is flush with that of the second electrode 16. The upper surface of the first electrode 114 being flush with that of the second electrode 16 facilitates the packaging of the micro LED by a flip-chip packaging manner.

At S17, the substrate 10 is removed, and the remaining part is transferred to a display panel 20.

In one example, the remaining part includes the first semiconductor layer 11, the first quantum well layer 121, the multiple nanorings 14, the second semiconductor layer 13, the current diffusion layer 17, the second electrode 16, and the first electrode 114.

Figure 12:
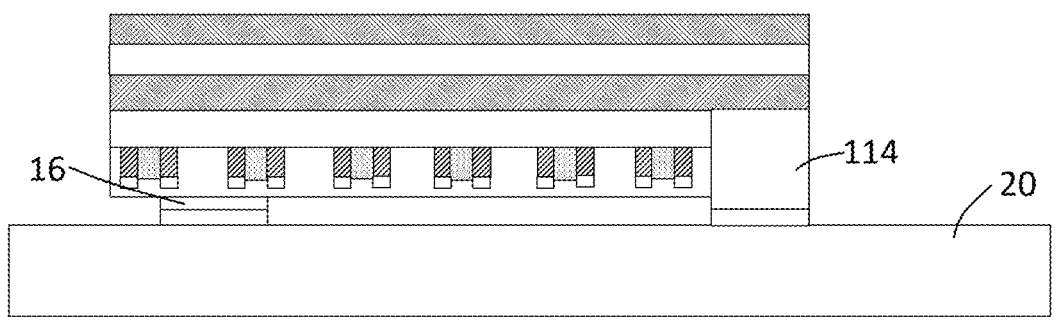
FIG. 12 is a schematic structural view illustrating bonding an LED to a display panel.

As illustrated in FIG. 12, the first electrode 114 and the second electrode 16 are bonded to electrodes on the display panel 20.

The color of the light emitted by the active layer 12 and the color of the color conversion material are merely used for the illustration. In other structures, when other materials from which the quantum well layer, the nanorings, and the color conversion materials are made are used, the concept of the disclosure can be realized as long as colors of light emitted by the first quantum well layer 121, the sidewall of the nanoring, and the color conversion material are different from one another.

The foregoing merely illustrates some implementations and is not intended to limit the disclosure. Any modification, equivalent substitution, improvement, or the like made within the spirit and principle of the disclosure should be included within the scope of protection of the disclosure.

The basic principles of the disclosure have been described above in conjunction with implementations. It should be noted that the advantages, effects, or the like mentioned in the disclosure are merely examples and not limitations, and should not be considered to be necessary for various implementations of the disclosure. In addition, the specific details of the above disclosure are only for purposes of example and understanding, and are not used for limiting the disclosure. The disclosure is not limited to the above-mentioned specific details.

What is claimed is:

1. A micro light-emitting diode (LED), comprising:
   a first semiconductor layer, an active layer, and a second semiconductor layer that are successively stacked together, wherein
   the first semiconductor layer and the second semiconductor layer are of different types;
   the active layer comprises a first quantum well layer and a second quantum well layer stacked together;
   the second quantum well layer and the second semiconductor layer form a nanoring;
   the first quantum well layer is configured to emit light of a first color, and the second quantum well layer forming a sidewall of the nanoring is configured to emit light of a second color different from the first color; and
   the first semiconductor layer is electrically coupled to a first electrode, and the second semiconductor layer is electrically coupled to a second electrode.

2. The micro LED of claim 1, wherein
   the first semiconductor layer is an N-type semiconductor layer, and comprises a low-temperature gallium nitride (GaN) layer, an undoped GaN layer, and an N-type GaN layer that are successively stacked; and
   the second semiconductor layer is a P-type semiconductor layer.

3. The micro LED of claim 1, wherein the nanoring is filled with color conversion materials, wherein the color conversion materials are configured to convert the light of the first color emitted by the first quantum well layer into light of a third color, wherein the first color, the second color, and the third color are different from one another.

4. The micro LED of claim 1, wherein the first quantum well layer and the second quantum well layer are both green quantum well layers, and the first quantum well layer and the second quantum well layer each are made from InGaN and GaN materials.

5. The micro LED of claim 3, wherein the color conversion materials are red quantum dots.

6. The micro LED of claim 4, wherein a pair of quantum wells comprise an indium gallium nitride (InGaN) well layer, a low-temperature GaN well layer, and a high-temperature GaN well layer that are stacked successively, and the first quantum well layer and the second quantum well layer each comprise ten pairs of green quantum wells.

7. The micro LED of claim 1, wherein the nanoring has an outer diameter ranging from 10 nm to 2000 nm.

8. The micro LED of claim 1, wherein the nanoring has an outer diameter ranging from 100 nm to 900 nm.

9. The micro LED of claim 1, wherein the nanoring has a cross section of a circular, a square, a rectangular, or any closed-loop shape.

10. The micro LED of claim 1, wherein
    a current diffusion layer is formed on the second semiconductor layer, wherein the current diffusion layer is made from an indium tin oxide (ITO) material;
    the second electrode is formed on a surface of the current diffusion layer away from the second semiconductor layer.

11. The micro LED of claim 10, wherein the first electrode is formed on a surface of the first semiconductor layer facing the second semiconductor layer, and an upper surface of the first electrode is flush with that of the second electrode.

12. The micro LED of claim 10, wherein the first electrode is formed on a surface of the first semiconductor layer away from the second semiconductor layer.

13. A manufacturing method for a micro light-emitting diode (LED), comprising:
    providing a substrate, forming a first semiconductor layer on the substrate, and forming an active layer on the first semiconductor layer, wherein the first semiconductor layer is a gallium nitride (GaN) semiconductor layer, and the active layer comprises a first quantum well layer and a second quantum well layer, wherein the first quantum well layer is configured to emit light of a first color;
    forming a second semiconductor layer on the active layer, wherein the second semiconductor layer and the first semiconductor layer are of different types;

etching the second semiconductor layer and the second quantum well layer to form a plurality of nanorings, wherein a sidewall of each of the plurality of nanorings is configured to emit light of a second color different from the first color;

forming a current diffusion layer on the first quantum well layer and the plurality of nanorings; and forming a second electrode on the current diffusion layer.

14. The manufacturing method of claim 13, further comprising:

after forming the second electrode on the current diffusion layer, removing a part of the current diffusion layer, a part of the plurality of nanorings, and a part of the first quantum well layer, to expose a part of the first semiconductor layer;

forming a first electrode on the exposed part of first semiconductor layer, wherein an upper surface of the first electrode is flush with that of the second electrode; and removing the substrate, transferring a remaining part to a display panel, and bonding the first electrode and the second electrode to electrodes on the display panel.

15. The manufacturing method of claim 13, further comprising:

after forming the plurality of nanorings and prior to forming the current diffusion layer on the plurality of nanorings:

filling color conversion materials in the plurality of nanorings, wherein the color conversion materials are configured to convert the light of the first color into light of a third color, wherein the third color is different from the first color and the second color.

16. The manufacturing method of claim 15, wherein the color conversion materials are red quantum dots.

17. The manufacturing method of claim 13, wherein a pair of quantum wells comprise an indium gallium nitride (InGaN) well layer, a low-temperature GaN well layer, and a high-temperature GaN well layer that are stacked successively, and the first quantum well layer and the second quantum well layer each comprise a plurality of pairs of green quantum wells.

18. The manufacturing method of claim 17, wherein number of quantum wells of the first quantum well layer is the same as that of the second quantum well layer.

19. The manufacturing method of claim 13, further comprising:

after forming the second electrode on the current diffusion layer, removing the substrate; and forming a third electrode on a surface of the first semiconductor layer away from the active layer.

20. The manufacturing method of claim 13, wherein the nanoring has a cross section of a circular, a square, or any closed-loop shape, and has an outer diameter ranging from 10 nm to 2000 nm.

* * * * *